United States Patent
Hu et al.

(10) Patent No.: US 11,621,241 B2
(45) Date of Patent: Apr. 4, 2023

(54) BONDING ELEMENT AND METHOD FOR MANUFACTURING THE SAME

(71) Applicant: NATIONAL YANG MING CHIAO TUNG UNIVERSITY, Hsinchu (TW)

(72) Inventors: Han-Wen Hu, Hsinchu County (TW); Demin Liu, Hsinchu (TW); Yi-Chieh Tsai, Taoyuan (TW); Kuan-Neng Chen, Hsinchu (TW)

(73) Assignee: NATIONAL YANG MING CHIAO TUNG UNIVERSITY, Hsinchu (TW)

( * ) Notice: Subject to any disclaimer, the term of this patent is extended or adjusted under 35 U.S.C. 154(b) by 82 days.

(21) Appl. No.: 17/477,996

(22) Filed: Sep. 17, 2021

(65) Prior Publication Data

US 2023/0025936 A1    Jan. 26, 2023

(30) Foreign Application Priority Data

Jul. 22, 2021 (TW) ................................ 110127041

(51) Int. Cl.
  *H01L 21/768* (2006.01)
  *H01L 23/48* (2006.01)
  *H01L 23/00* (2006.01)

(52) U.S. Cl.
  CPC .............. *H01L 24/13* (2013.01); *H01L 24/81* (2013.01); *H01L 2224/1318* (2013.01); *H01L 2224/13021* (2013.01); *H01L 2224/13083* (2013.01); *H01L 2224/13118* (2013.01); *H01L 2224/13124* (2013.01); *H01L 2224/13139* (2013.01);

(Continued)

(58) Field of Classification Search
  CPC .................... H01L 24/13; H01L 24/81; H01L 2224/81005; H01L 2224/81193; H01L 2224/81895; H01L 2224/13021
  See application file for complete search history.

(56) References Cited

U.S. PATENT DOCUMENTS

| 9,337,126 B2 * | 5/2016 | Li | H01L 23/481 |
| 2017/0040372 A1 * | 2/2017 | Ho | H01L 27/14687 |

OTHER PUBLICATIONS

D. Liu, P.-C, Chen and K.-N. Chen, "A Novel Low-Temperature Cu—Cu Direct Bonding with Cr Wetting Layer and Au Passivation Layer," *2020 IEEE 70th Electronic Components and Technology Conference (ECTC)*, 2020, pp. 1322-1327.

(Continued)

*Primary Examiner* — Hoa B Trinh
(74) *Attorney, Agent, or Firm* — Muncy, Geissler, Olds & Lowe, P.C.

(57) ABSTRACT

A bonding element and a method for manufacturing the same thereof are provide, wherein the method comprises the following steps: providing a carrier substrate; forming a first metal layer on the carrier substrate; forming a first insulating layer on the first metal layer, wherein the first insulating layer includes a first through hole; forming a first passivation layer and a first conductive layer in the first through hole, wherein the first passivation layer and the first conductive layer in the first through hole form a first connecting bump; forming a first substrate on the first connection bump and the first insulating layer; removing the carrier substrate and the first metal layer to form a first sub-bonding element; and connecting the first sub-bonding element and a second sub-bonding element with a surface of the first passivation of the first connection bump to form the bonding element.

20 Claims, 8 Drawing Sheets

(52) U.S. Cl.
CPC ............... *H01L 2224/13144* (2013.01); *H01L 2224/13147* (2013.01); *H01L 2224/13149* (2013.01); *H01L 2224/13155* (2013.01); *H01L 2224/13157* (2013.01); *H01L 2224/13164* (2013.01); *H01L 2224/13166* (2013.01); *H01L 2224/13169* (2013.01); *H01L 2224/13171* (2013.01); *H01L 2224/13176* (2013.01); *H01L 2224/13181* (2013.01); *H01L 2224/81005* (2013.01); *H01L 2224/81193* (2013.01); *H01L 2224/81895* (2013.01)

(56) References Cited

OTHER PUBLICATIONS

M. Aoki, K. Hozawa and K. Takeda, "Wafer-level hybrid bonding technology with copper/polymer co-planarization," *2010 IEEE International 3D Systems integration Conference (3DIC)*, 2010, pp. 1-4.
D. Liu et al., "Low Temperature Cu/SiO2 Hybrid Bonding with Metal Passivation," *2020 IEEE Symposium on VLSI Technology*, 2020, pp. 1-2.

* cited by examiner

BONDING ELEMENT AND METHOD FOR MANUFACTURING THE SAME

CROSS REFERENCE TO RELATED APPLICATION

This application claims the benefits of the Taiwan Patent Application Serial Number 110127041, filed on Jul. 22, 2021, the subject matter of which is incorporated herein by reference.

BACKGROUND

1. Field

The present disclosure relates to a bonding element and a method for manufacturing the same. More specifically, the present disclosure relates to a bonding element with high bonding reliability or prepared with simplified process or low manufacturing cost, and a method for manufacturing the same.

2. Description of Related Art

With the development of technology and in response to consumer needs, most of today's electronic products are developing towards a high degree of integration, that is, a single electronic device can have multiple functions. The more multifunctional electronic products are accompanied by the higher the number of chips required and the higher the number of chip I/Os.

However, in the general traditional bonding process, due to the limitation of the flatness of the device surface, components such as solders or bumps are often used for bonding, and the density of the interconnects is also limited. To increase the interconnect density, it is necessary to perform processes such as planarization before bonding, which leads to the increasing of the manufacturing cost. In addition, the high temperature in the traditional bonding process may also easily cause device damage and reduce the process yield.

Therefore, it is desirable to provide a bonding element and a method for manufacturing the same to improve the shortcomings occurred when the bonding element is prepared by using the traditional bonding technology.

SUMMARY

It should be noted that, in the present specification, when a component is described to have an element, it means that the component may have one or more of the elements, and it does not mean that the component has only one of the element, except otherwise specified. Moreover, in the present specification and claims, the ordinal numbers, such as "first" or "second", are used to distinguish a plurality of elements having the same name, and it does not means that there is essentially a level, a rank, an executing order, or an manufacturing order among the elements, except otherwise specified. A "first" element and a "second" element may exist together in the same component, or alternatively, they may exist in different components, respectively. The existence of an element described by a greater ordinal number does not essentially means the existent of another element described by a smaller ordinal number.

It should be noted that, in the present specification, the terms such as "comprise", "have", "include" are open-ended terms, and they should be interpreted as meaning "contains but is not limited to". Therefore, in the present specification, when the term "comprise", "include" and/or "have are used, it means the existence of corresponding feature, region, step, operation and/or component, but does not exclude one or more corresponding features, regions, steps, operations and/ or components.

In the present specification, except otherwise specified, the terms (including technical and scientific terms) used herein have the meanings generally known by a person skilled in the art. It should be noted that, except otherwise specified in the embodiments of the present disclosure, these terms (for example, the terms defined in the generally used dictionary) should have the meanings identical to those known in the art, the background of the present disclosure or the context of the present specification, and should not be read by an ideal or over-formal way.

Furthermore, relative terms may be used in the present disclosure, such as "below" or "bottom" and "above" or "top" to describe the relative relationship between one element and another element of the diagram. It should be understood that if the device in the drawing is turned upside down, the elements described on the "lower" side will become the elements on the "upper" side. When the corresponding component (such as a layer or region) is called "on another component", it can be directly on another component, or there may be other components between these two components. On the other hand, when a component is called "directly on another component", there is no component between these two components. In addition, when a component is called "on another component", these two components have a vertical relationship in the top view direction, and this component can be above or below the another component, and this vertical relationship depends on the device orientation In the present disclosure, the length and width can be measured by using an optical microscope, and the thickness can be measured by a cross-sectional image obtained by using an electron microscope, but the disclosure is not limited to this.

In addition, the terms "ranging from the first value to the second value" and "ranging between the first value and the second value" indicate that the range includes the first value, the second value, and other values between the first value and the second value.

The present disclosure provides a method for manufacturing a bonding element, which comprises the following steps: providing a carrier substrate; forming a first metal layer on the carrier substrate; forming a first insulating layer on the first metal layer, wherein the first insulating layer comprises a first through hole; forming a first passivation layer in the first through hole; forming a first conductive layer on the first passivation layer, wherein the first passivation layer and the first conductive layer in the first through hole of the first insulating layer form a first connecting bump; forming a first substrate on the first connecting bump and the first insulating layer; removing the carrier substrate and the first metal layer to expose a surface of the first passivation layer of the first connecting bump and a surface of the first insulating layer to obtain a first sub-bonding element; and connecting the first sub-bonding element and a second sub-bonding element with the surface of the first passivation layer of the first connecting bump to form a bonding element.

In the present disclosure, the material of the carrier substrate and the first substrate is not particularly limited, and may respectively be a quartz substrate, a glass substrate, a silicon wafer, a sapphire substrate, a flexible and rigid mixed board or other rigid substrate. Alternatively, the carrier substrate and the first substrate may respectively a flexible substrate or a film, and the material thereof may comprise polycarbonate (PC), polyimide (PI), polypropylene (PP), polyethylene terephthalate (PET) or other plastic material. However, the present disclosure is not limited thereto. In the present disclosure, the same or different materials may be used to prepare the carrier substrate and the first substrate. In addition, in one embodiment of the present disclosure, a release layer may be further comprised between the carrier substrate and the first metal layer, which can facilitate the subsequent steps of removing the carrier substrate. Herein, the release layer may comprise an adhesive, epoxy resin, die attach film (DAF) or the like; but the present disclosure is not limited thereto.

In the present disclosure, the material of the first metal layer is not particularly limited and may comprise, for example Cu, Ni, Ti, Cr, an alloy thereof or a combination thereof; but the present disclosure is not limited thereto. The first metal layer may be formed by a single layer or multi-layers of the metal materials. For example, in one embodiment of the present disclosure, the first metal layer may be formed by Ti/Cu multi-layered metal materials.

In the present disclosure, the material of the first insulating layer may be polyimide (PI), photosensitive PI (PSPI), epoxy resin, polybenzoxazole (PBO), benzocyclobutene (BCB), silicon nitride, silicon oxide, silicon oxynitride, silicon carbonitride, resin, polymer or a combination thereof, but the present disclosure is not limited thereto. In one embodiment of the present disclosure, the first through hole may be formed in the first insulating layer by a lithography process, but the present disclosure is not limited thereto. In the present disclosure, the first passivation layer and the first conductive layer may be formed in the first through hole of the first insulating layer. In other words, the first passivation layer and the first conductive layer may be surrounded by the first insulating layer; thereby, the reliability of the first connecting bump can be improved, and the reliability of the bonding element subsequently formed can be improved. In the present disclosure, the first conductive layer and/or the first passivation layer may further formed on a sidewall of the first through hole. More specifically, when the first passivation layer is formed in the first through hole and the first conductive layer is formed on the sidewall of the first through hole, the first conductive layer may directly contact the sidewall of the first through hole. When the first passivation layer and the first conductive layer are formed on the sidewall of the first through hole, the first passivation layer may directly contact the sidewall of the first through hole.

In the present disclosure, the material of the first passivation layer may comprise at least one selected from the group consisting of Au, Ag, Cu, Pd, Pt, Ru, Al, Co, Ni, Ti, Mo, Mn and Zn. The material of the first passivation layer may be a single metal material, an alloy thereof or a combination thereof. The specific examples of the metal alloy may comprise constantan, manganese, copper, etc.; but the present disclosure is not limited thereto. In addition, among the aforesaid material of the first passivation layer, the material may include a metal material with crystal orientation arranging randomly, or a metal material that more than 50% of a volume of the metal material has crystal orientation arranging along the same crystal axis. For example, the metal material may be a metal material that more than 50% of a volume of the metal material has crystal orientation arranging along the [111], [100], [311] or [220] crystal axis; but the present disclosure is not limited thereto.

The thickness of the first passivation layer may be ranged from 1 nm to 300 nm, for example, from 1 nm to 200 nm, 1 nm to 150 nm, 1 nm to 100 nm, 1 nm to 80 nm, 1 nm to 50 nm, 1 nm to 30 nm, 3 nm to 80 nm, 3 nm to 50 nm, 5 nm to 50 nm or 5 nm to 30 nm, but the present disclosure is not limited thereto.

In the present disclosure, the first passivation layer may protect the first conductive layer and prevent the first conductive layer from being oxidized during the bonding process to improve the reliability of the bonding element or improve the bonding effect. In addition, the first passivation layer may decrease the temperature of the bonding process, and thus the manufacturing cost can be reduced or the process yield can be increased. In one embodiment of the present disclosure, the material of the first passivation layer may comprise Au, but the present disclosure is not limited thereto. In another embodiment of the present disclosure, the material of the first passivation layer may comprise Ag, but the present disclosure is not limited thereto.

In the present disclosure, the material of the first conductive layer may comprise Cu, but the present disclosure is not limited thereto. The thickness of the first conductive layer is not particularly limited, and may be adjusted according to the components to be bonded. In the present disclosure, the first metal layer, the first passivation layer and the first conductive layer may be respectively formed by sputtering, electroplating, chemical plating, chemical vapor deposition or other methods. In addition, the first metal layer, the first passivation layer and the first conductive layer may be prepared by the same or different methods.

In the present disclosure, the method for removing the first carrier substrate and the first metal layer is not particularly limited, and may be performed by any process know in the art. In one embodiment of the present disclosure, the first metal layer may be removed by an etching process including wet etching, dry etching or a combination thereof, but the present disclosure is not limited thereto.

In the present disclosure, the temperature of the bonding process may be ranged from room temperature to 250° C., for example, room temperature to 200° C., room temperature to 180° C., room temperature to 150° C., room temperature to 120° C., room temperature to 100° C., 50° C. to 200° C., 80° C. to 200° C., 80° C. to 180° C. or 50° C. to 150° C., but the present disclosure is not limited thereto. In addition, the time for performing the bonding process may be greater than or equal to 10 seconds, and for example, may be ranged from 10 seconds to 90 minutes, 10 seconds to 80 minutes, 10 seconds to 60 minutes, 10 seconds to 300 seconds or 10 minutes to 60 minutes, but the present disclosure is not limited thereto. The time for performing the bonding process may be adjusted according to the components to be bonded. For example, when the components to be bonded have chip-scales, the bonding time may be ranged from 15 seconds to 180 seconds. When the components to be bonded have wafer-scales, the bonding time may be ranged from 15 minutes to 50 minutes. However, the present disclosure is not limited thereto.

In one embodiment of the present disclosure, the method may further comprise a step of: forming a wetting layer on the first passivation layer before the step of forming the first conductive layer on the first passivation layer. More specifically, the wetting layer may be further disposed in the first through hole of the first insulating layer, and the wetting layer is disposed between the first passivation layer and the first conductive layer.

In the present disclosure, the temperature of the bonding process may be further decreased by using the wetting layer.

Therefore, the manufacturing cost may be decreased, or the shortcomings of device damage caused by high temperature can be improved. In the present disclosure, the material of the wetting layer may be any material capable of providing the wetting effect. For example, the material of the wetting layer may comprise at least one selected from the group consisting of Ti, Cr, Ni. Co, Ta, an alloy thereof and a combination thereof. Among the aforesaid metal material, the metal material may include a metal material arranged along any crystal axis. For example, the metal material may be a metal material arranged along the [111], [100], [311] or [220] crystal axis; but the present disclosure is not limited thereto. In addition, the wetting layer may be prepared by similar method for preparing the first metal layer or the first passivation layer, so the method for preparing the wetting layer is not repeated again. The thickness of the wetting layer may be ranged from 0.1 nm to 50 nm, for example, may be ranged from 0.5 nm to 30 nm, 0.5 nm to 15 nm, 0.5 nm to 10 nm, 1 nm to 50 nm, 1 nm to 30 nm, 1 nm to 10 nm, 1 nm to 8 nm or 1 nm to 5 nm, but the present disclosure is not limited thereto.

In one embodiment of the present disclosure, the method may further comprise a step of: forming a second metal layer on the first connecting bump and the first insulating layer before the step of forming the first substrate on the first connecting bump and the first insulating layer. Herein, the material and the preparing method for the second metal layer are similar to those of the first metal layer, and are not repeated again. In addition, the second metal layer may contact the first connecting bump to provide electrical connection.

In the present disclosure, the surface of the first conductive layer of the first connecting bump before the step of forming the first substrate on the first connecting bump and the first insulating layer has a first roughness. More specifically, before the step of forming the first substrate on the first connecting bump and the first insulating layer, the method of the present disclosure may further comprise a step of: etching the first passivation layer and the first conductive layer to obtain the first connecting bump. Hence, the "first roughness" refers to the roughness of the upper surface (i.e. the surface away from the carrier substrate) of the first conductive layer in the first through hole, and more specifically, the "first roughness" refers to the roughness of the surface of the first conductive layer after etching the first passivation layer and the first conductive layer.

After the step of removing the carrier substrate and the first metal layer, the exposed surface (i.e. the surface away from the first substrate) of the first passivation layer of the first connecting bump has a second roughness. The first roughness is not equal to the second roughness, and more specifically, the first roughness is greater than the second roughness. Hence, when the first sub-bonding element is bonded to the second sub-bonding element with the surface of the first passivation layer of the first connecting bump, there is no need to perform other processes such as planarization, which can reduce manufacturing costs or achieve the effect of high interconnect density.

In another embodiment of the present disclosure, after the step of forming the first connecting bump, the method of the present disclosure may further comprise steps of: forming an insulating layer on the first connecting bump, wherein the insulating layer comprises a through hole; and forming a third connecting bump in the through hole, wherein the third connecting bump comprises a wetting layer and a conductive layer, the wetting layer is disposed between the first connecting bump and the conductive layer, and the wetting layer contacts the first conductive layer. Therefore, the first sub-bonding element may further comprise a third connecting bump, and the first connecting bump may be electrically connected to the third connecting bump to provide signals or electrical transmission. In addition, the bonding element may comprise one or more third connecting bumps if it is needed, and thus the formed bonding element may be applied to film laminations of the redistribution layer, 2.5D package, etc. However, the present disclosure is not limited thereto.

In the present disclosure, the second sub-bonding element may comprise: a second substrate; a second insulating layer disposed on the second substrate and comprising a second through hole; and a second connecting bump disposed in the second through hole and comprising a second passivation layer and a second conductive layer, wherein the second conductive layer is disposed between the second passivation layer and the second substrate. Hence, when the first sub-bonding element and the second sub-bonding element are bonded, the first passivation layer of the first connecting bump may be connected to the second passivation layer of the second connecting bump, and the first insulating layer of the first sub-bonding element may be connected to the second insulating layer of the second sub-bonding element. In one embodiment of the present disclosure, when the first sub-bonding element and the second sub-bonding element are bonded, the first passivation layer of the first connecting bump is connected to the second passivation layer of the second connecting bump to form an interconnect, wherein the interconnect further comprises a connecting layer formed between the first passivation layer and the second passivation layer. In the present disclosure, the first passivation layer of the first connecting bump of the first sub-bonding element can directly bond to the second passivation layer of the second connecting bump of the second sub-bonding element, so there is no need to perform additional lithography process or other steps, which can simplify the process steps or reduce the manufacturing cost.

In the present disclosure, the connecting layer may comprise a first metal. The material of the first conductive layer or the second conductive layer may pass through the first passivation layer, the second passivation layer or the wetting layer and diffuse into the connecting layer. Thus, the connecting layer may comprise the metal comprised in the first conductive layer or the second conductive layer. In one embodiment of the present disclosure, the material of the first conductive layer or the second conductive layer may comprise Cu, and thus the first metal comprised in the connecting layer may be Cu.

In one embodiment of the present disclosure, the material of the wetting layer may also diffuse into the connecting layer. Thus, the connecting layer may further comprise a second metal, which may comprise the material comprised in the wetting layer. More specifically, the second metal may comprise at least one selected from the group consisting of Ti, Cr, Ni, Co and Ta. In one embodiment of the present disclosure, the formed connecting layer may comprise the first metal and the second metal, which has better bonding effect compared to the connecting layer comprising the first metal.

In the present disclosure, the manufacturing method and the material of the second sub-bonding element may be similar to those of the first sub-bonding element, and are not repeated again. However, the present disclosure is not limited thereto. In addition, the second connecting bump is disposed in the second through hole of the second insulating layer; and in other words, the second connecting bump may be surrounded by the second insulating layer. Thus, the reliability of the second connecting bump can be improved, and the reliability of the bonding element subsequently formed may further be improved.

The bonding element prepared by the aforesaid method may comprise: a first sub-bonding element comprising: a first substrate; a first insulating layer disposed on the first substrate and comprising a first through hole; and a first connecting bump disposed in the first through hole and comprising a first passivation layer and a first conductive layer, wherein the first conductive layer is disposed between the first passivation layer and the first substrate; and a second sub-bonding element comprising: a second substrate; a second insulating layer disposed on the second substrate and comprising a second through hole; and a second connecting bump disposed in the second through hole and comprising a second passivation layer and a second conductive layer, wherein the second conductive layer is disposed between the second passivation layer and the second substrate. Herein, the first passivation layer of the first connecting bump is connected to the second passivation layer of the second connecting bump, and the first insulating layer of the first sub-bonding element is connected to the second insulating layer of the second sub-bonding element.

In the present disclosure, the first connecting bump is disposed in the first through hole of the first insulating layer; and in other words, the first connecting bump may be surrounded by the first insulating layer. Thus, the reliability of the first sub-bonding element can be improved, and the reliability of the bonding element subsequently formed may further be improved. Similarly, the second connecting bump is disposed in the second through hole of the second insulating layer; and, in other words, the second connecting bump may be surrounded by the second insulating layer. Thus, the reliability of the second sub-bonding element can be improved, and the reliability of the bonding element subsequently formed may further be improved.

In one embodiment of the present disclosure, the first passivation layer of the first connecting bump is connected to the second passivation layer of the second connecting bump to form an interconnect, and the interconnect further comprises a connecting layer formed between the first passivation layer and the second passivation layer. Hence, the first sub-bonding element and the second sub-bonding element are bonded via the connecting layer, which can improve the bonding effect of the first sub-bonding element and the second sub-bonding element. Therefore, the reliability of the bonding element can be improved, or the interconnect density can be increased.

In the present disclosure, in a cross section of the bonding element, the first connecting bump has a first surface and a second surface, the first surface faces the first substrate and is opposite to the second surface, and a width of the first surface is greater than a width of the second surface. In addition, the second connecting bump has a third surface and a fourth surface, the third surface faces the second substrate and is opposite to the fourth surface, and a width of the third surface is greater than a width of the fourth surface.

In one embodiment of the present disclosure, the first sub-bonding element may further comprise a wetting layer disposed on the first passivation layer, and the wetting layer is disposed between the first passivation layer and the first conductive layer. In addition, the second sub-bonding element may further comprise another wetting layer disposed on the second passivation layer. Another wetting layer is disposed between the second passivation layer and the second conductive layer. Herein, the material of another wetting layer may be similar to the material of the wetting layer, and is not described again. In addition, the material of the wetting layer and another wetting layer may be the same or different.

In the present disclosure, the connecting layer may comprise a first metal, which can be the metal comprised in the first conductive layer and the second conductive layer. In one embodiment of the present disclosure, the material of the first conductive layer or the second conductive layer may comprise Cu, and thus, the first metal can be Cu. In addition, in one embodiment of the present disclosure, the connecting layer may further comprise a second metal, which can be the metal comprised in the wetting layer of the first sub-bonding element or another wetting layer of the second sub-bonding element. More specifically, the second metal may comprise at least one selected from the group consisting of Ti, Cr, Ni, Co and Ta.

In another embodiment of the present disclosure, the first sub-bonding element may further comprise: an insulating layer disposed on the first connecting bump and comprising a through hole; and a third connecting bump disposed in the through hole and comprising a wetting layer and a conductive layer, wherein the wetting layer is disposed between the first connecting bump and the conductive layer, and the wetting layer contacts the first conductive layer. Thus, the first connecting bump can be electrically connected to the third connecting bump to provide signals or electrical transmission. The formed bonding element may be applied to film laminations of the redistribution layer, 2.5D package, etc., but the present disclosure is not limited thereto. Similarly, the second sub-bonding element may also comprise a third connecting bump if it is needed, and the description thereof is not repeated again.

In conclusion, the present disclosure provides a novel method for manufacturing a bonding element, which has improved bonding effect without performing additional planarization or lithography. In addition, the method provided by the present disclosure may decrease the temperature of the bonding process, and the effect of reducing manufacturing cost or improving the process yield may be achieved. Furthermore, the bonding element prepared by the method of the present disclosure may has improved reliability or increased interconnect density.

Other novel features of the disclosure will become more apparent from the following detailed description when taken in conjunction with the accompanying drawings.

DETAILED DESCRIPTION OF EMBODIMENT

The following embodiments when read with the accompanying drawings are made to clearly exhibit the above-mentioned and other technical contents, features and/or effects of the present disclosure. Through the exposition by means of the specific embodiments, people would further understand the technical means and effects the present disclosure adopts to achieve the above-indicated objectives. Moreover, as the contents disclosed herein should be readily understood and can be implemented by a person skilled in the art, all equivalent changes or modifications which do not depart from the concept of the present disclosure should be encompassed by the appended claims.

In addition, the features in different embodiments of the present disclosure can be replaced, combined or mixed to form another embodiment without violating the spirit of this disclosure.

Embodiment 1

FIG. 1A to FIG. 1H are schematic views showing a process for manufacturing a bonding element according to one embodiment of the present disclosure. FIG. 2A and FIG. 2B are cross-sectional views of a bonding element according to Embodiment 1 of the present disclosure.

Figure 1A:
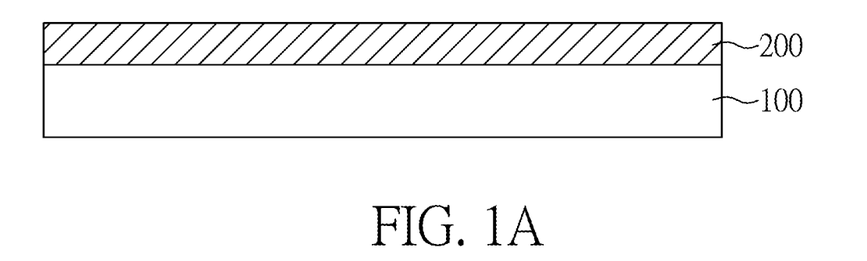
FIG. 1A to FIG. 1H are schematic views showing a process for manufacturing a bonding element according to one embodiment of the present disclosure.
Figure 1B:
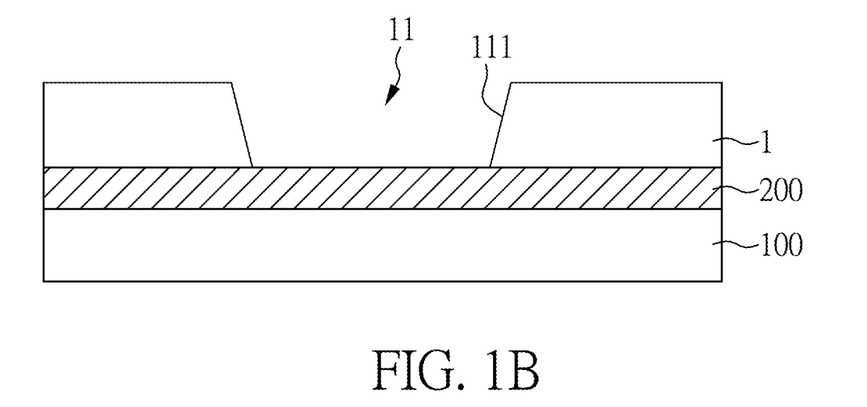
Figure 1C:
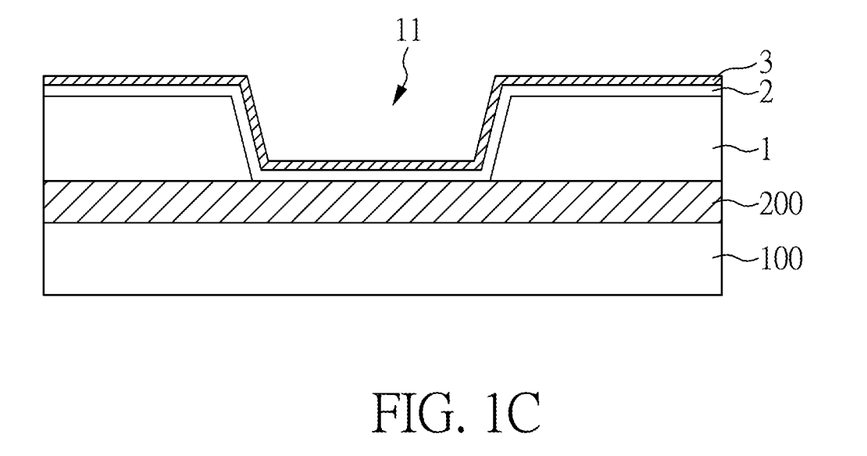
Figure 2A:
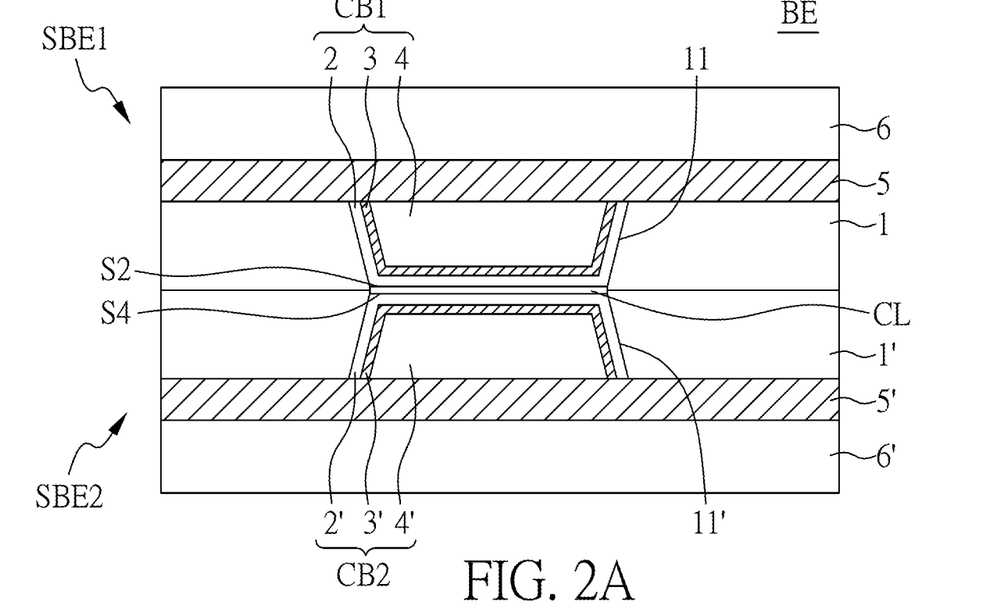
FIG. 2A is a cross-sectional view of a bonding element according to one aspect of Embodiment 1 of the present disclosure.
Figure 2B:
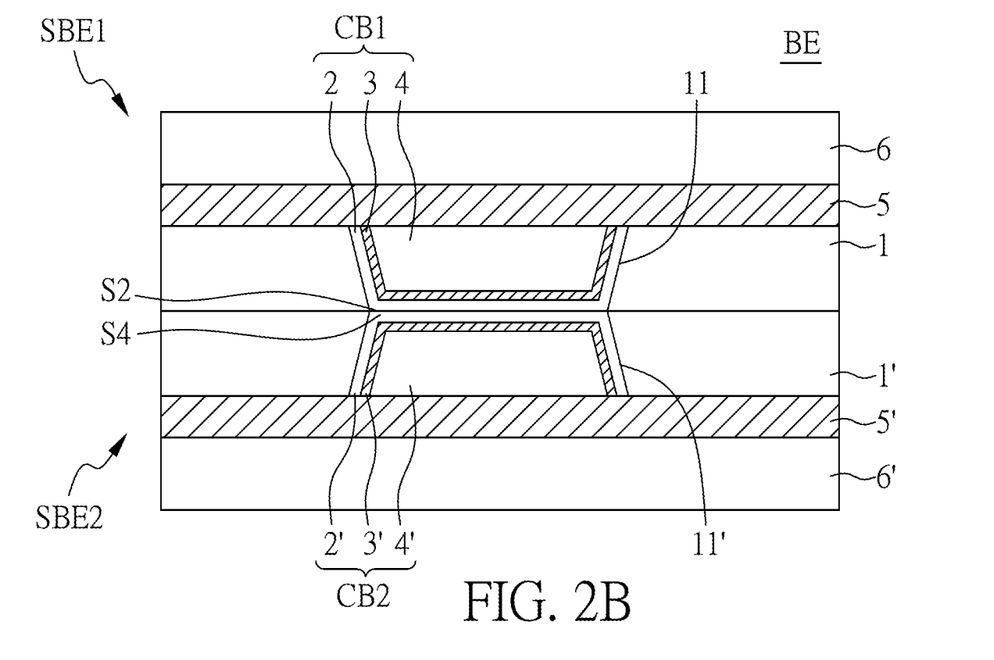
FIG. 2B is a cross-sectional view of a bonding element according to another aspect of Embodiment 1 of the present disclosure.

As shown in FIG. 1A, a carrier substrate 100 is provided, followed by forming a first metal layer 200 on the carrier substrate 100. Next, as shown in FIG. 1B, a first insulating layer 1 is formed on the first metal layer 200, wherein a first through hole 11 is formed in the first insulating layer 1 via a lithography process. Then, as shown in FIG. 1C, a first passivation layer 2 is formed on the first insulating layer 1 and in the first through hole 11; and a wetting layer 3 is also formed on the first passivation layer 2 and in the first through hole 11. More specifically, the first passivation layer 2 and the wetting layer 3 may be formed on the sidewall 111 of the first through hole 11, wherein the first passivation layer 2 may contact the sidewall 111 of the first through hole 11.

Figure 1D:
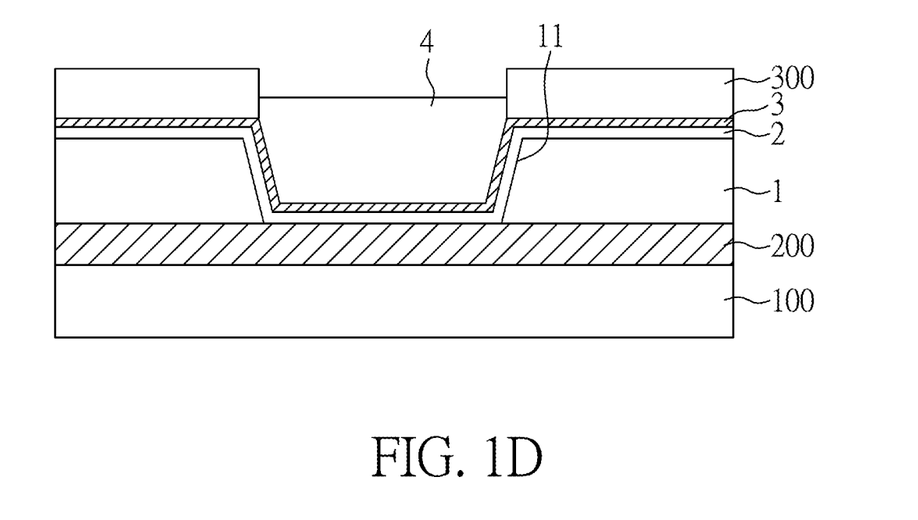

As shown in FIG. 1D, a patterned resin 300 is formed on the wetting layer 3 via a lithography process, and the patterned resin 300 is not disposed in the first through hole 11. Then, Cu is electroplated on the wetting layer 3 to form a first conductive layer 4. More specifically, the first conductive layer 4 is formed on the wetting layer 3 in the first through hole 11.

Figure 1E:
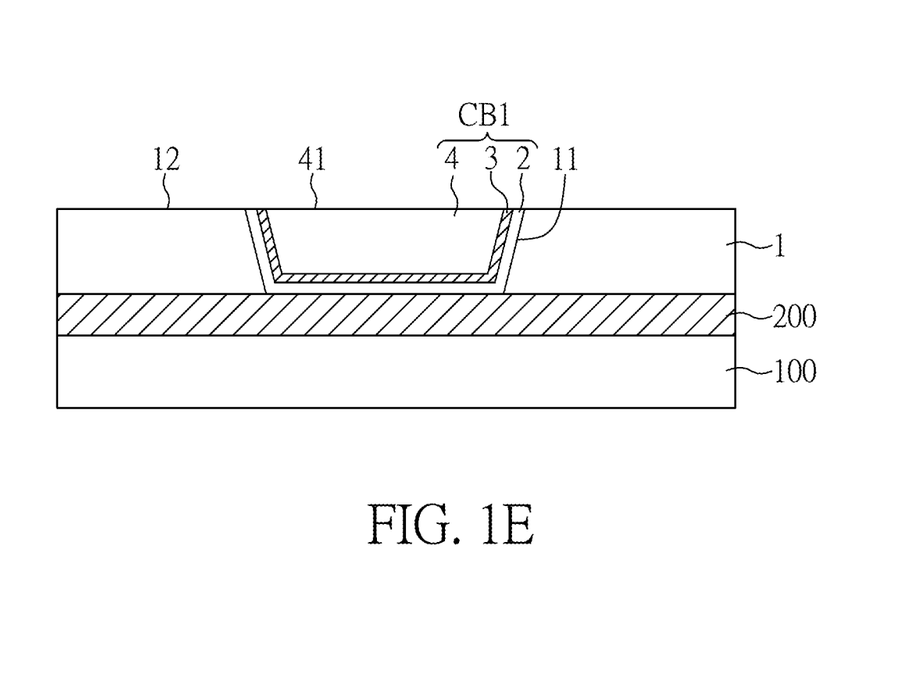

As shown in FIG. 1E, a part of first conductive layer 4, the first passivation layer 2, the wetting layer 3, and the resin 300 are removed to expose a surface 12 of the first insulating layer 1. Herein, the surface 12 of the first insulating layer 1 refers to the surface of the first insulating layer 1 away from the carrier substrate 100. Herein, the first passivation layer 2, the wetting layer 3 and the first conductive layer 4 in the first through hole 11 of the first insulating layer 1 together form a first connecting bump CB1, and the surface 41 of the first conductive layer 4 of the first connecting bump CB1 has a first roughness. Herein, the surface 41 of the first conductive layer 4 refers to the surface of the first conductive layer 4 away from the carrier substrate 100.

Figure 1F:
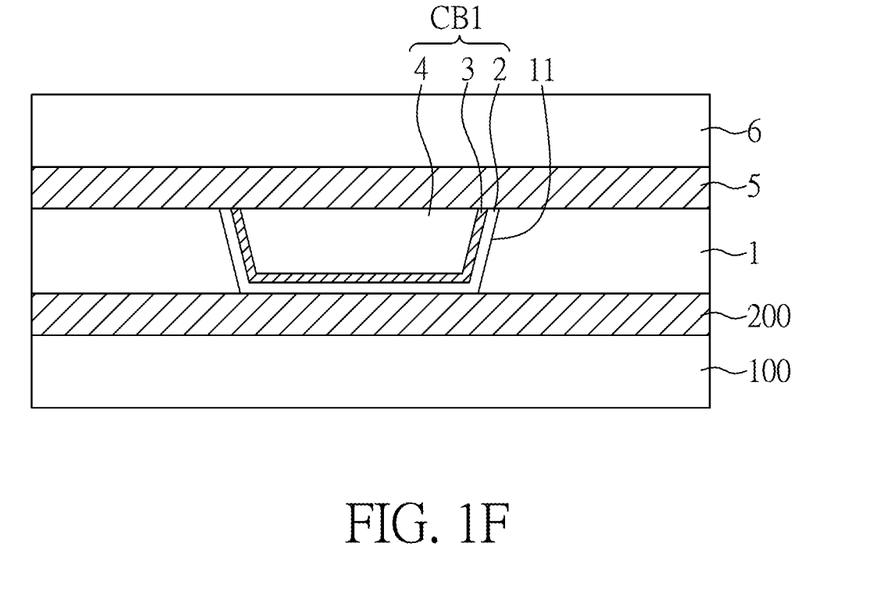

As shown in FIG. 1F, the second metal layer 5 and the first substrate 6 are formed on the first connecting bump CB1 and the first insulating layer 1. More specially, the second metal layer 5 is firstly formed on the first connecting bump CB1 and the first insulating layer 1, and then the first substrate 6 is formed on the second metal layer 5.

Figure 1G:
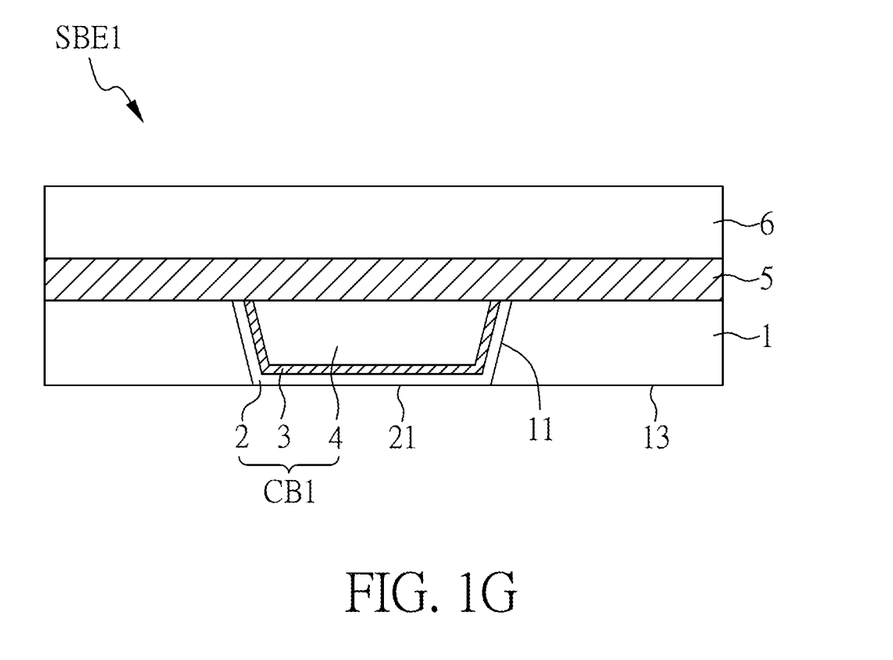

As shown in FIG. 1G, the carrier substrate 100 and the first metal layer 200 are respectively removed to expose the surface 21 of the first passivation layer 2 of the first connecting bump CB1 and the surface 13 of the first insulating layer 1, and thus a first sub-bonding element SBE1 is obtained. Therefore, the first sub-bonding element SBE1 comprises: a first substrate 6; a first insulating layer 1 disposed on the first substrate 6 and comprising a first through hole 11; and a first connecting bump CB1 disposed in the first through hole 11 and comprising a first passivation layer 2 and a first conductive layer 4, wherein the first conductive layer 4 is disposed between the first passivation layer 2 and the first substrate 6.

Herein, the first sub-bonding element SBE1 further comprises a second metal layer 5 disposed on the first connecting bump CB1 and the first insulating layer 1. The first connecting bump CB1 further comprises a wetting layer 3 disposed between the first passivation layer 2 and the first conductive layer 4.

Herein, the surface 21 of the first passivation layer 2 refers to the surface of the first passivation layer 2 away from the first substrate 6; and the surface 13 of the first insulating layer 1 refers to the surface of the first insulating layer 1 away from the first substrate 6. The surface 21 of the first passivation layer 2 has a second roughness, and the first roughness of the surface 41 of the first conductive layer 4 (see FIG. 1E) is greater than the second roughness. Since the second roughness is relatively small, it is advantageous to use the surface 21 of the first passivation layer 2 of the first connecting bump CB1 to perform the subsequent bonding process.

Figure 1H:
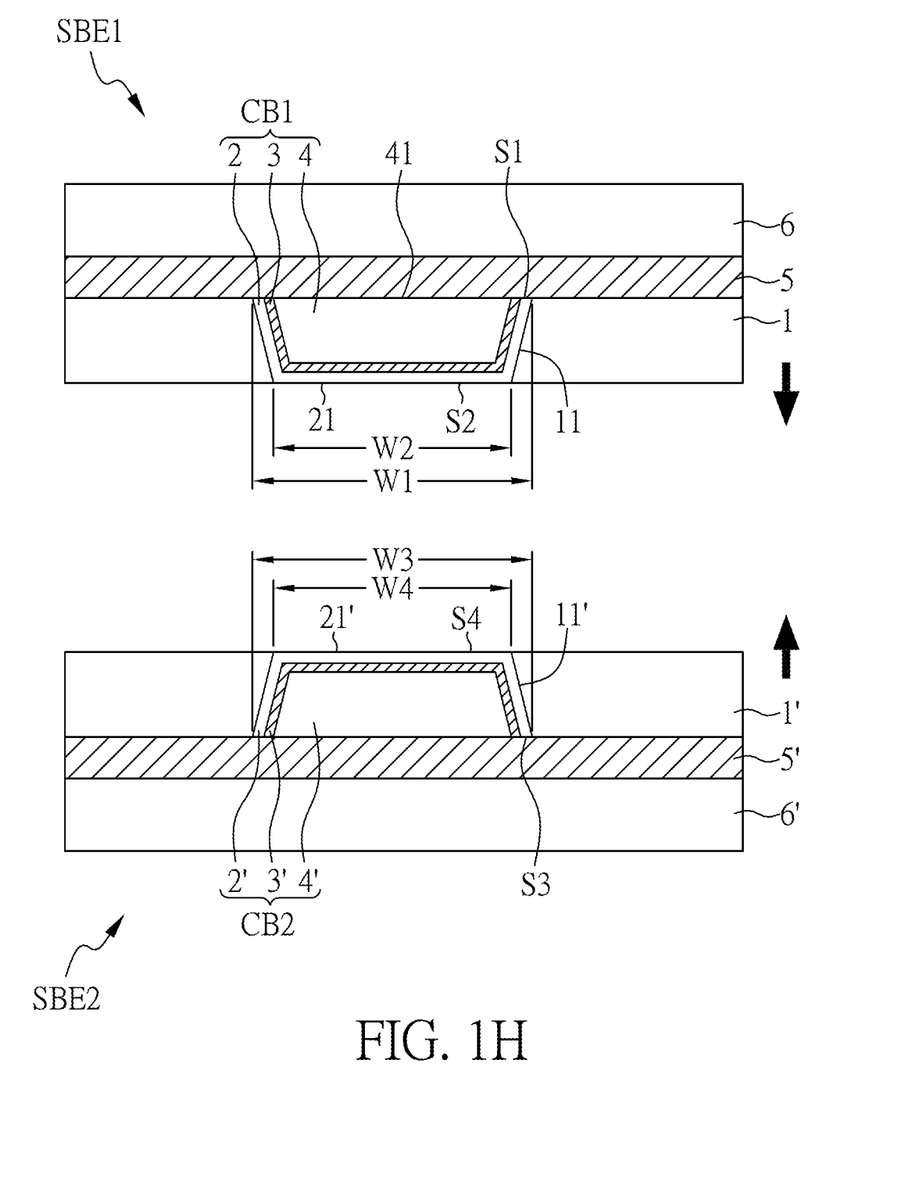

As shown in FIG. 1H, the first sub-bonding element SBE1 is connected to the second sub-bonding element SBE2 with the surface 21 of the first passivation layer 2 of the first connecting bump CB1, and the bonding element BE as shown in FIG. 2A or FIG. 2B is formed. Herein, the second sub-bonding element SBE2 may be prepared by the same method for preparing the first sub-bonding element SBE1. Thus, the second sub-bonding element SBE2 comprises: a second substrate 6'; a second insulating layer 1' disposed on the second substrate 6' and comprising a second through hole 11'; and a second connecting bump CB2 disposed in the second through hole 11' and comprising a second passivation layer 2' and a second conductive layer 4', wherein the second conductive layer 4' is disposed between the second passivation layer 2' and the second substrate 6'. Herein, the second sub-bonding element SBE2 further comprises a third metal layer 5' disposed on the second connecting bump CB2 and the second insulating layer 1'. The second connecting bump CB2 further comprises a wetting layer 3' disposed between the second passivation layer 2' and the second conductive layer 4'. In addition, the first sub-bonding element SBE1 is bonded to the second sub-bonding element SBE2 with the surface 21 of the first passivation layer 2 of the first connecting bump CB1. Similarly, the second sub-bonding element SBE2 is bonded to the first sub-bonding element SBE1 with the surface 21' of the second passivation layer 2' of the second connecting bump CB2.

As shown in FIG. 1H, in a cross section of the bonding element, the first connecting bump CB1 has a first surface S1 and a second surface S2, the first surface S1 faces the first substrate 6 and is opposite to the second surface S2. In other words, the first surface S1 is close to the first substrate 6 and the second surface S2 is away from the first substrate 6. Herein, a width W1 of the first surface S1 is greater than a width W2 of the second surface S2. Similarly, in a cross section of the bonding element, the second connecting bump CB2 has a third surface S3 and a fourth surface S4, the third surface S3 faces the second substrate 6' and is opposite to the fourth surface S4. In other words, the third surface S3 is close to the second substrate 6' and the fourth surface S4 is away from the second substrate 6'. Herein, a width W3 of the third surface S3 is greater than a width W4 of the fourth surface S4.

In one aspect of the present embodiment, as shown in FIG. 2A, when the first sub-bonding element SBE1 is bonded to the second sub-bonding element SBE2, the first passivation layer 2 of the first connecting bump CB1 is connected to the second passivation layer 2' of the second connecting bump CB2 to form an interconnect, and the first insulating layer 1 of the first sub-bonding element SBE1 is connected to the second insulating layer 1' of the second sub-bonding element SBE2. In addition, the interconnect further comprises a connecting layer CL formed between the first passivation layer 2 and the second passivation layer 2'. Thus, as shown in FIG. 2A, the bonding element BE comprises: a first sub-bonding element SBE1 comprising a first substrate 6; a first insulating layer 1 disposed on the first substrate 6 and comprising a first through hole 11; and a first connecting bump CB1 disposed in the first through hole 11 and comprising a first passivation layer 2 and a first conductive layer 4, wherein the first conductive layer 4 is disposed between the first passivation layer 2 and the first substrate 6; and a second connecting bump CB2 comprising a second substrate 6'; a second insulating layer 1' disposed on the second substrate 6' and comprising a second through hole 11'; and a second connecting bump CB2 disposed in the second through hole 11' and comprising a second passivation layer 2' and a second conductive layer 4', wherein the second conductive layer 4' is disposed between the second passivation layer 2' and the second substrate 6'. Herein, the first passivation layer 2 of the first connecting bump CB1 is connected to the second passivation layer 2' of the second connecting bump CB2 to form an interconnect, the first insulating layer 1 of the first sub-bonding element SBE1 is connected to the second insulating layer 1' of the second sub-bonding element SBE2, and the interconnect further comprises a connecting layer CL formed between the first passivation layer 2 and the second passivation layer 2'. Herein, the first connecting bump CB1 further comprises a wetting layer 3 disposed between the first passivation layer 2 and the first conductive layer 4, and the second connecting bump CB2 further comprises a wetting layer 3' disposed between the second passivation layer 2' and the second conductive layer 4'.

The material of the first conductive layer 4 may pass through the first passivation layer 2 or the wetting layer 3 and diffuse into the connecting layer CL. Similarly, the material of the second conductive layer 4' may pass through the second passivation layer 2' or the wetting layer 3' and diffuse into the connecting layer CL. Thus, the connecting layer CL may comprise the metal comprised in the first conductive layer 4 or the second conductive layer 4'. In addition, the material of the wetting layer 3 or the wetting layer 3' may also diffuse into the connecting layer CL, so the connecting layer CL may comprises the material comprised in the wetting layer 3 or the wetting layer 3'.

As shown in FIG. 2A, the first sub-bonding element SBE1 and the second sub-bonding element SBE2 are substantially aligned. In other words, in the top view direction of the first substrate 6 of the bonding element BE, the second surface S2 of the first connecting bump CB1 substantially overlaps the fourth surface S4 of connecting bump CB2. Herein, the "substantially overlap" means that the overlapping area of the second surface S2 of the first connecting bump CB1 and the fourth surface S4 of the second connecting bump CB1 is greater than or equal to 90%. However, even not shown in the figure, in another aspect of the present embodiment, the second surface S2 of the first connecting bump CB1 may not completely overlap the fourth surface S4 of the second connecting bump CB2, as long as the purpose of electrical connection can be achieved. Herein, the "not completely overlap" means that the overlapping area of the second surface S2 of the first connecting bump CB1 and the fourth surface S4 of the second connecting bump CB1 is less than 90%. For example, the overlapping area may be greater than or equal to 50% but less than 90%, but the present disclosure is not limited thereto. Thus, a portion of the first passivation layer 2 of the first connecting bump CB1 may be connected to a portion of the second insulating layer 1' of the second sub-bonding element SBE2. Similarly, a portion of the second passivation layer 2' of the second connecting bump CB2 may be connected to a portion of the first insulating layer 1 of the first sub-bonding element SBE1.

FIG. 2B is a cross-sectional view of a bonding element according to another aspect of the present embodiment. The bonding element shown in FIG. 2B is similar to that shown in FIG. 2A, except for the following differences.

In another aspect of the present embodiment, as shown in FIG. 2B, when the first sub-bonding element SBE1 is bonded to the second sub-bonding element SBE2, the first passivation layer 2 of the first connecting bump CB1 connects to the second passivation layer 2' of the second connecting bump CB2, and the first insulating layer 1 of the first sub-bonding element SBE1 connects to the second insulating layer 1' of the second sub-bonding element SBE2. More specifically, the first passivation layer 2 of the first connecting bump CB1 directly contacts the second passivation layer 2' of the second connecting bump CB2.

In addition, as shown in FIG. 2B, the first sub-bonding element SBE1 and the second sub-bonding element SBE2 are substantially aligned. In other words, in the top view direction of the first substrate 6 of the bonding element BE, the second surface S2 of the first connecting bump CB1 substantially overlaps the fourth surface S4 of connecting bump CB2. However, even not shown in the figure, in another aspect of the present embodiment, the second surface S2 of the first connecting bump CB1 may not completely overlap the fourth surface S4 of the second connecting bump CB2, as long as the purpose of electrical connection can be achieved. Thus, a portion of the first passivation layer 2 of the first connecting bump CB1 may be connected to a portion of the second insulating layer 1' of the second sub-bonding element SBE2. Similarly, a portion of the second passivation layer 2' of the second connecting bump CB2 may be connected to a portion of the first insulating layer 1 of the first sub-bonding element SBE1.

Embodiment 2

Figure 3A:
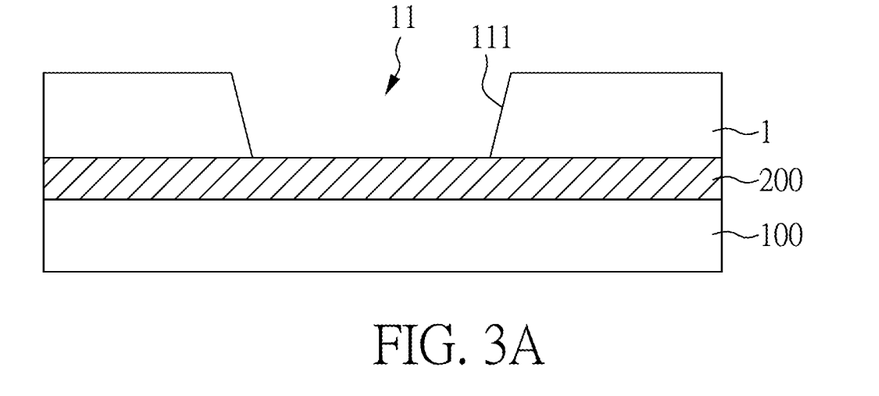
FIG. 3A to FIG. 3C are schematic views showing a process for manufacturing a bonding element according to another embodiment of the present disclosure.
Figure 3B:
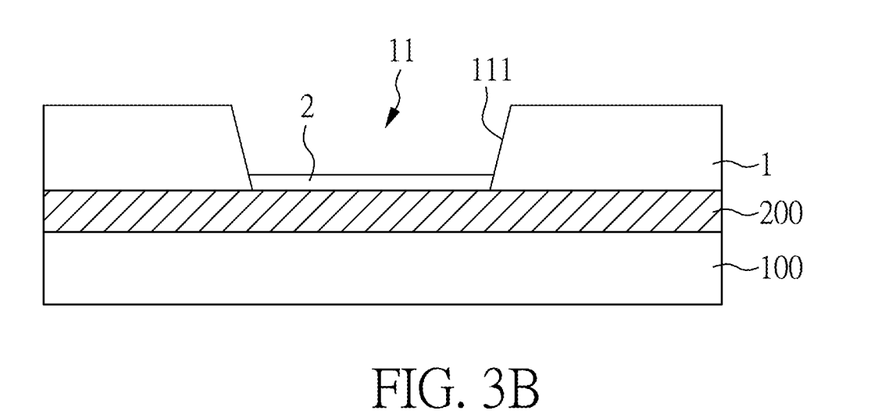
Figure 3C:
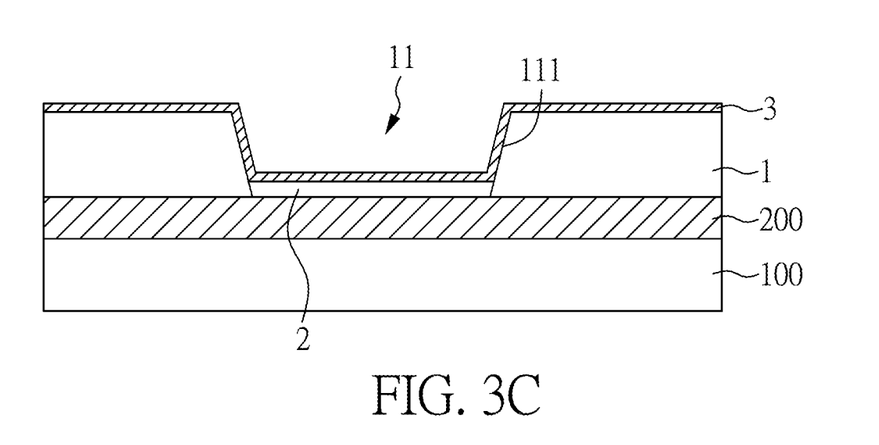
Figure 4A:
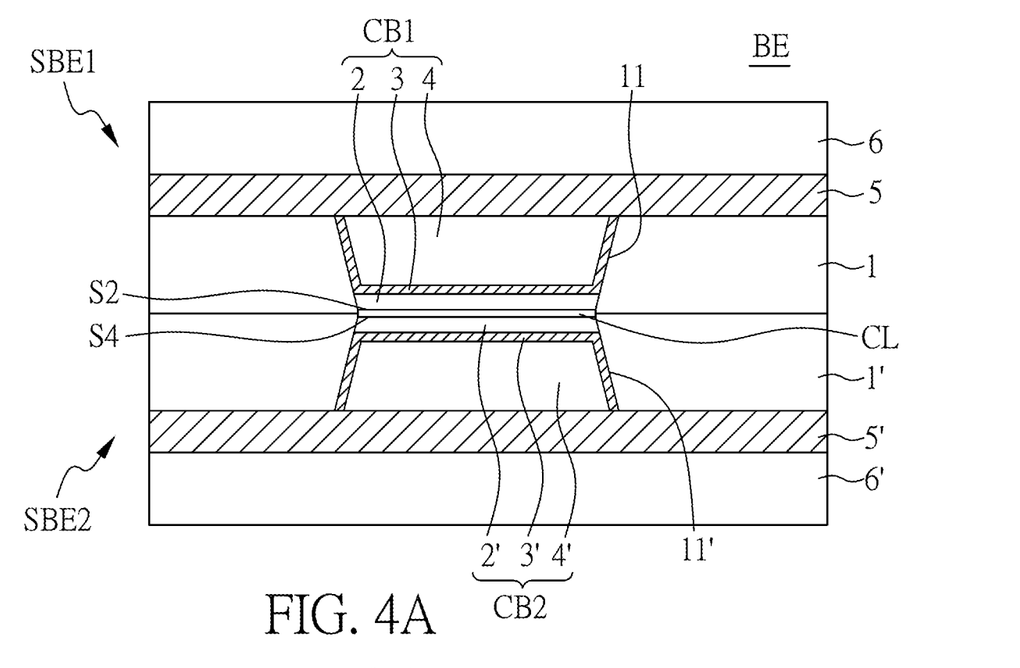
FIG. 4A is a cross-sectional view of a bonding element according to one aspect of Embodiment 2 of the present disclosure.
Figure 4B:
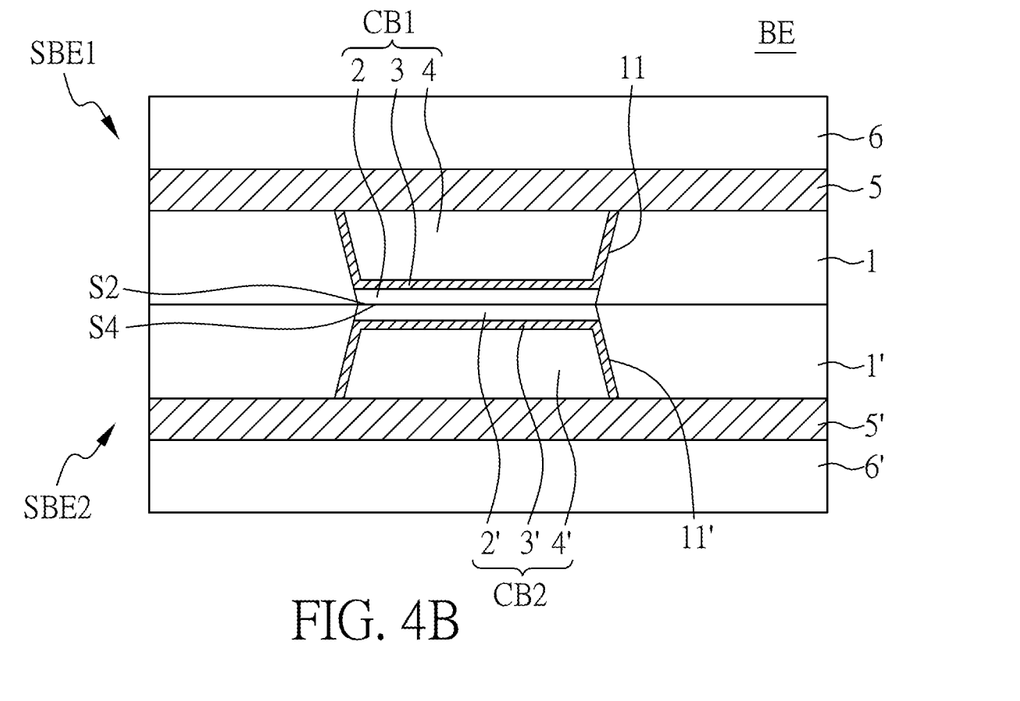
FIG. 4B is a cross-sectional view of a bonding element according to another aspect of Embodiment 2 of the present disclosure.

FIG. 3A to FIG. 3C are schematic views showing a process for manufacturing a bonding element according to another embodiment of the present disclosure. FIG. 4A and FIG. 4B are cross-sectional views of a bonding element according to Embodiment 2 of the present disclosure. Herein, the process shown in FIG. 3A to FIG. 3C is similar to that shown in FIG. 1A to FIG. 1C, except for the following differences.

As shown in FIG. 3A, a carrier substrate 100 is provided, followed by forming a first metal layer 200 on the carrier substrate 100. Next, a first insulating layer 1 is formed on the first metal layer 200, and a first through hole 11 is formed in the first insulating layer 1 via lithography. Then, as shown in FIG. 3B, a first passivation layer 2 is formed in the first through hole 11 by chemical plating. As shown in FIG. 3C, a wetting layer 3 is formed on the first insulating layer 1 and the first passivation layer 2, and also in the first through hole 11. More specifically, since the first passivation layer 2 is formed by chemical plating, so the first passivation layer 2 may not form on the first insulating layer 1, and the wetting layer 3 subsequently formed may directly contact the sidewall 111 of the first through hole 11.

Then, by using the similar manufacturing process illustrated in FIG. 1 (more specifically, the subsequent process can refer to the process shown in FIG. 1D to FIG. 1H), the first conductive layer 4, the second metal layer 5 and the first substrate 6 are sequentially formed, and then the carrier substrate 100 and the first metal layer 200 are removed to obtain the first sub-bonding element SBE1. Then, as shown in FIG. 4A or FIG. 4B, the sub-bonding element SBE1 is bonded to a second sub-bonding element SBE2 with the surface 21 of the first passivation layer 2 of the first connecting bump CB1 to form a bonding element BE. Herein, the second sub-bonding element SBE2 can be prepared by the similar method for preparing the first sub-bonding element SBE1. Thus, in the second sub-bonding element SBE2, the second passivation layer 2' may not form on the second insulating layer 1', and the wetting layer 3' may directly contact the sidewall of the second through hole 11'.

Hence, in the present embodiment, the formed bonding element BE has the structure shown in FIG. 4A, wherein the bonding element BE shown in FIG. 4A is similar to that shown in FIG. 2A, except for the following differences.

As shown in FIG. 4A, when the first sub-bonding element SBE1 is bonded to the second sub-bonding element SBE2, the first passivation layer 2 of the first connecting bump CB1 connects to the second passivation layer 2' of the second connecting bump CB2 to form an interconnect, and the first insulating layer 1 of the first sub-bonding element SBE1 connects to the second insulating layer 1' of the second sub-bonding element SBE2. In addition, the interconnect further comprises a connecting layer CL formed between the first passivation layer 2 and the second passivation layer 2'. The difference between the bonding elements BE shown in FIG. 2A and FIG. 4A is that, in the bonding element BE shown in FIG. 4A, the first passivation layer 2 may not be formed on the first insulating layer 1, and the wetting layer 3 may directly contact the sidewall of the first through hole 11. Similarly, the second passivation layer 2' may not be formed on the second insulating layer 1', and the wetting layer 3' may directly contact the sidewall of the second through hole 11'.

As shown in FIG. 4A, the first sub-bonding element SBE1 and the second sub-bonding element SBE2 are substantially aligned. In other words, in the top view direction of the first substrate 6 of the bonding element BE, the second surface S2 of the first connecting bump CB1 substantially overlaps the fourth surface S4 of connecting bump CB2. Even not shown in the figure, in another aspect of the present embodiment, the second surface S2 of the first connecting bump CB1 may not completely overlap the fourth surface S4 of the second connecting bump CB2, as long as the purpose of electrical connection can be achieved. Thus, a portion of the first passivation layer 2 of the first connecting bump CB1 may be connected to a portion of the second insulating layer 1' of the second sub-bonding element SBE2. Similarly, a portion of the second passivation layer 2' of the second connecting bump CB2 may be connected to a portion of the first insulating layer 1 of the first sub-bonding element SBE1.

FIG. 4B is a cross-sectional view of a bonding element according to another aspect of the present embodiment. The bonding element shown in FIG. 4B is similar to that shown in FIG. 4A, except for the following differences.

In another aspect of the present embodiment, as shown in FIG. 4B, when the first sub-bonding element SBE1 is bonded to the second sub-bonding element SBE2, the first passivation layer 2 of the first connecting bump CB1 connects to the second passivation layer 2' of the second connecting bump CB2, and the first insulating layer 1 of the first sub-bonding element SBE1 connects to the second insulating layer 1' of the second sub-bonding element SBE2. More specifically, the first passivation layer 2 of the first connecting bump CB1 directly contacts the second passivation layer 2' of the second connecting bump CB2.

In addition, as shown in FIG. 4B, the first sub-bonding element SBE1 and the second sub-bonding element SBE2 are substantially aligned. In other words, in the top view direction of the first substrate 6 of the bonding element BE, the second surface S2 of the first connecting bump CB1 substantially overlaps the fourth surface S4 of connecting bump CB2. However, even not shown in the figure, in another aspect of the present embodiment, the second surface S2 of the first connecting bump CB1 may not completely overlap the fourth surface S4 of the second connecting bump CB2, as long as the purpose of electrical connection can be achieved. Thus, a portion of the first passivation layer 2 of the first connecting bump CB1 may be connected to a portion of the second insulating layer 1' of the second sub-bonding element SBE2. Similarly, a portion of the second passivation layer 2' of the second connecting bump CB2 may be connected to a portion of the first insulating layer 1 of the first sub-bonding element SBE1.

Figure 5:
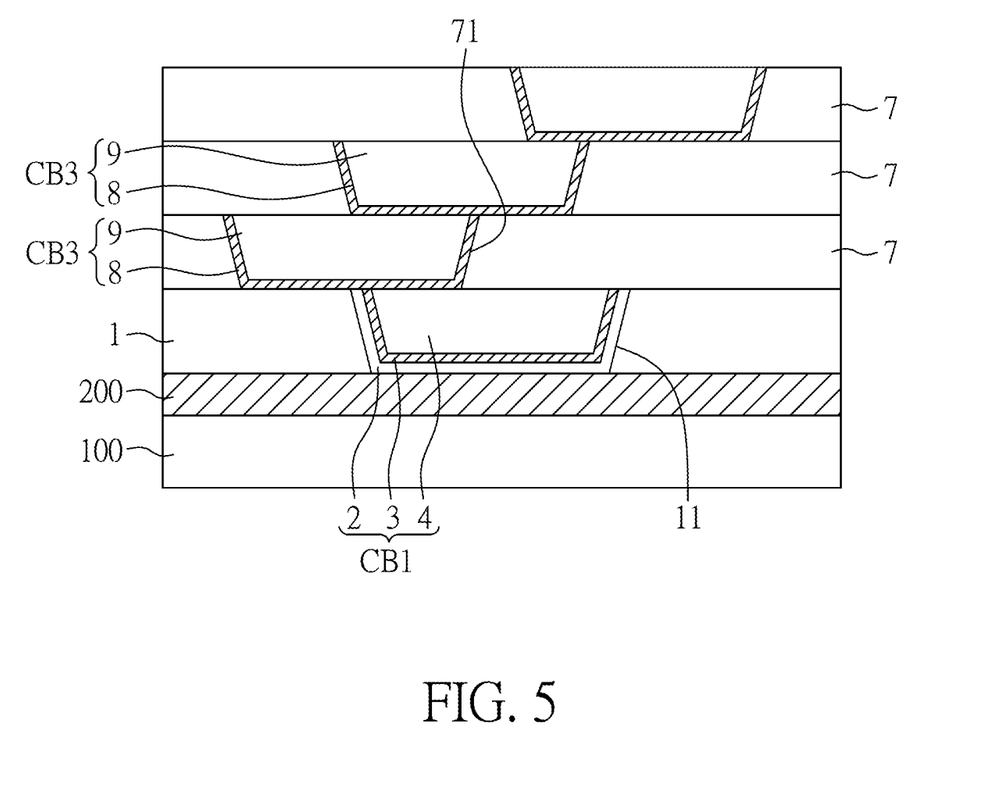
FIG. 5 is a schematic view showing a process for manufacturing a bonding element according to further another embodiment of the present disclosure.

FIG. 5 is a schematic view showing a process for manufacturing a bonding element according to further another embodiment of the present disclosure. The process for manufacturing the bonding element shown in FIG. 5 is similar to that shown in FIG. 1E, except for the following differences.

As shown in FIG. 5, after forming the first connecting bump CB1, the method of the present embodiment may further comprise the steps of: forming an insulating layer 7 on the first connecting bump CB1, wherein the insulating layer 7 comprises a through hole 71; and forming a third connecting bump CB3 in the through hole 71, wherein the third connecting bump CB3 comprises a wetting layer 8 and a conductive layer 9, the wetting layer 8 is disposed between the first connecting bump CB1 and the conductive layer 9, and the wetting layer 8 contacts the first conductive layer 4. Therefore, the obtained first sub-bonding element may further comprise a third connecting bump CB3, and the connecting bump CB1 is electrically connected to the third connecting bump CB3 to provide signal or electrical transmission. In addition, as shown in FIG. 5, the sub-bonding element may comprise plural insulating layers 7 and plural third connecting bumps CB3 to form a multi-layered lamination. Furthermore, even not shown in the figure, the third connecting bump CB3 may selectively further comprise a passivation layer, and the wetting layer 8 is disposed between the passivation layer and the conductive layer 9. Similarly, even not shown in the figure, the second sub-bonding element may further comprises one or more insulating layers 7 and one or more third connecting bump CB3 to form a multi-layered lamination. In addition, even not shown in the figure, in another embodiment of the present disclosure, the first connecting bump may be firstly prepared by the method shown in Embodiment 2, and then the insulating layer 7 is formed on the first connecting bump CB1, wherein the insulating layer 7 comprises a through hole. Then, a third connecting bump CB3 is formed in the through hole 71.

Experimental Example 1

The bonding element used in Experimental example 1 was prepared by the method shown in Embodiment 1, and the bonding element BE used in Experimental example 1 may have the structure shown in FIG. 2A. Herein, the materials of the first passivation layer 2 and the second passivation layer 2' were Au, and the thicknesses of the first passivation layer 2 and the second passivation layer 2' were 8 nm respectively. The materials of the wetting layer 3 and the wetting layer 3' were Cr, and the thicknesses of the wetting layer 3 and the wetting layer 3' were 2 nm respectively. The materials of the first conductive layer 4 and the second conductive layer 4' were Cu, and the thicknesses of the first conductive layer 4 and the second conductive layer 4' were 400 nm respectively. The materials of the first insulating layer 1 and the second insulating layer 1' were PI. After analyzing with Auger electron spectroscopy (AES), it can be found that the connecting layer CL comprised Cr and Cu. In addition, when the temperature of the bonding process was 100° C. and the bonding time was 15 minutes, or when the temperature of the bonding process was 70° C. and the bonding time was 180 seconds, the obtained bonding elements BE have improved bonding effect.

Experimental Example 2

The bonding element used in Experimental example 2 was prepared by the method shown in Embodiment 1, and the bonding element BE used in Experimental example 2 may have the structure shown in FIG. 2A. Herein, the materials of the first passivation layer 2 and the second passivation layer 2' were Ag, and the thicknesses of the first passivation layer 2 and the second passivation layer 2' were 10 nm respectively. The materials of the wetting layer 3 and the wetting layer 3' were Ti, and the thicknesses of the wetting layer 3 and the wetting layer 3' were 2 nm respectively. The materials of the first conductive layer 4 and the second conductive layer 4' were Cu, and the thicknesses of the first conductive layer 4 and the second conductive layer 4' were 780 nm respectively. The materials of the first insulating layer 1 and the second insulating layer 1' were $SiO_2$. After analyzing with AES, it can be found that the connecting layer CL comprised Cu. In addition, when the temperature of the bonding process was 80° C. to 150° C. and the bonding time was 3 minutes, the obtained bonding elements BE have improved bonding effect.

Experimental Example 3

The bonding element used in Experimental example 3 was prepared by the method shown in Embodiment 1, and the bonding element BE used in Experimental example 3 may have the structure shown in FIG. 2B. Herein, the materials of the passivation layer 2 and the second passivation layer 2' were Au, and the thicknesses of the passivation layer 2 and the second passivation layer 2' were 80 nm respectively. The materials of the wetting layer 3 and the wetting layer 3' were Cr, and the thicknesses of the wetting layer 3 and the wetting layer 3' were 25 nm respectively. The materials of the first conductive layer 4 and the second conductive layer 4' were Cu, and the thicknesses of the first conductive layer 4 and the second conductive layer 4' were 300 nm respectively. The materials of the first insulating layer 1 and the second insulating layer 1' were $SiO_2$. When the temperature of the bonding process was 100° C. and the bonding time was 30 minutes, the obtained bonding elements BE have improved bonding effect.

Experimental Example 4

The bonding element used in Experimental example 4 was prepared by the method shown in Embodiment 2. The bonding element BE used in Experimental example 4 may have the structure shown in FIG. 4A, but the bonding element BE of the present experimental example does not comprise the wetting layer 3 and the wetting layer 3' shown in FIG. 2A.

Herein, the materials of the first passivation layer 2 and the second passivation layer 2' were Au, the thicknesses of the first passivation layer 2 and the second passivation layer 2' were 10 nm respectively. The materials of the first conductive layer 4 and the second conductive layer 4' were Cu, and the thicknesses of the first conductive layer 4 and the second conductive layer 4' were 800 nm respectively. The materials of the first insulating layer 1 and the second insulating layer 1' were PI. After analyzing, it can be found that a connecting layer CL is formed between the first passivation layer 2 and the second passivation layer 2'. When the temperature of the bonding process was 150° C. and the bonding time was 15 minutes, the obtained bonding elements BE have improved bonding effect.

Although the present disclosure has been explained in relation to its embodiment, it is to be understood that many other possible modifications and variations can be made without departing from the spirit and scope of the disclosure as hereinafter claimed.

What is claimed is:

1. A method for manufacturing a bonding element, comprising the following steps:
   providing a carrier substrate;
   forming a first metal layer on the carrier substrate;
   forming a first insulating layer on the first metal layer, wherein the first insulating layer comprises a first through hole;
   forming a first passivation layer in the first through hole;
   forming a first conductive layer on the first passivation layer, wherein the first passivation layer and the first conductive layer in the first through hole of the first insulating layer form a first connecting bump;
   forming a first substrate on the first connecting bump and the first insulating layer;
   removing the carrier substrate and the first metal layer to expose a surface of the first passivation layer of the first connecting bump and a surface of the first insulating layer to obtain a first sub-bonding element; and
   connecting the first sub-bonding element and a second sub-bonding element with the surface of the first passivation layer of the first connecting bump to form a bonding element.

2. The method of claim 1, further comprising a step of: etching the first passivation layer and the first conductive layer to form the first connecting bump before the step of forming the first substrate on the first connecting bump and the first insulating layer.

3. The method of claim 1, further comprising a step of: forming a wetting layer on the first passivation layer before the step of forming the first conductive layer on the first passivation layer.

4. The method of claim 3, wherein the wetting layer is further disposed in the first through hole of the first insulating layer, and the wetting layer is disposed between the first passivation layer and the first conductive layer.

5. The method of claim 1, further comprising a step of: forming a second metal layer on the first connecting bump and the first insulating layer before the step of forming the first substrate on the first connecting bump and the first insulating layer.

6. The method of claim 1, wherein a surface of the first conductive layer of the first connecting bump before the step of forming the first substrate on the first connecting bump and the first insulating layer has a first roughness, the surface of the first passivation layer of the first connecting bump exposed after the step of removing the carrier substrate and the first metal layer has a second roughness, and the first roughness is greater than the second roughness.

7. The method of claim 1, wherein the first sub-bonding element and the second sub-bonding element are connected at a temperature ranging from room temperature to 250° C.

8. The method of claim 1, wherein the second sub-bonding element comprises:
   a second substrate;
   a second insulating layer disposed on the second substrate and comprising a second through hole; and
   a second connecting bump disposed in the second through hole and comprising a second passivation layer and a second conductive layer, wherein the second conductive layer is disposed between the second passivation layer and the second substrate.

9. The method of claim 8, wherein the first passivation layer of the first connecting bump is connected to the second passivation layer of the second connecting bump, and the first insulating layer of the first sub-bonding element is connected to the second insulating layer of the second sub-bonding element.

10. The method of claim 8, wherein the first passivation layer of the first connecting bump is connected to the second passivation layer of the second connecting bump to form an interconnect, the first insulating layer of the first sub-bonding element is connected to the second insulating layer of the second sub-bonding element, and the interconnect further comprises a connecting layer formed between the first passivation layer and the second passivation layer.

11. The method of claim 10, wherein the connecting layer comprises a first metal, which is a metal comprised in the first conductive layer or the second conductive layer.

12. The method of claim 11, wherein the connecting layer further comprises a second metal, which comprises at least one selected from the group consisting of Ti, Cr, Ni, Co and Ta.

13. The method of claim 1, wherein a material of the first passivation layer comprises at least one selected from the group consisting of Au, Ag, Cu, Pd, Pt, Ru, Al, Co, Ni, Ti, Mo, Mn and Zn.

14. A bonding element, comprising:
   a first sub-bonding element, comprising:
      a first substrate;
      a first insulating layer disposed on the first substrate and comprising a first through hole; and
      a first connecting bump disposed in the first through hole and comprising a first passivation layer and a first conductive layer, wherein the first conductive layer is disposed between the first passivation layer and the first substrate; and
   a second sub-bonding element, comprising:
      a second substrate;
      a second insulating layer disposed on the second substrate and comprising a second through hole; and
      a second connecting bump disposed in the second through hole and comprising a second passivation layer and a second conductive layer, wherein the second conductive layer is disposed between the second passivation layer and the second substrate,
   wherein the first passivation layer of the first connecting bump is connected to the second passivation layer of the second connecting bump, and the first insulating layer of the first sub-bonding element is connected to the second insulating layer of the second sub-bonding element.

15. The bonding element of claim 14, wherein the first passivation layer of the first connecting bump is connected to the second passivation layer of the second connecting bump to form an interconnect, and the interconnect further comprises a connecting layer formed between the first passivation layer and the second passivation layer.

16. The bonding element of claim 15, wherein the connecting layer comprises a first metal, which is a metal comprised in the first conductive layer or the second conductive layer.

17. The bonding element of claim 16, wherein the connecting layer further comprises a second metal, which comprises at least one selected from the group consisting of Ti, Cr, Ni, Co and Ta.

18. The bonding element of claim 14 wherein in a cross section of the bonding element, the first connecting bump has a first surface and a second surface, the first surface faces the first substrate and is opposite to the second surface, and a width of the first surface is greater than a width of the second surface.

19. The bonding element of claim 14, wherein in a cross section of the bonding element, the second connecting bump has a third surface and a fourth surface, the third surface faces the second substrate and is opposite to the fourth surface, and a width of the third surface is greater than a width of the fourth surface.

20. The bonding element of claim 14, wherein a material of the first passivation layer or a material of the second passivation layer comprises at least one selected from the group consisting of Au, Ag, Cu, Pd, Pt, Ru, Al, Co, Ni, Ti, Mo, Mn and Zn.

* * * * *